United States Patent [19]
Tumpey et al.

[11] Patent Number: 5,498,907
[45] Date of Patent: Mar. 12, 1996

[54] INTERCONNECTION ARRANGEMENT FOR POWER SEMICONDUCTOR SWITCHING DEVICES

[75] Inventors: John J. Tumpey, Oakhurst; Sampat Shekhawat, Middletown; Gayton L. Silvestro, Brick; John J. Brogle, Lawrenceville, all of N.J.

[73] Assignee: Allied Signal Inc., Morris Township, N.J.

[21] Appl. No.: 304,620

[22] Filed: Sep. 12, 1994

Related U.S. Application Data

[63] Continuation of Ser. No. 53,747, Apr. 29, 1993, abandoned.

[51] Int. Cl.$^6$ ................................................. H01L 23/34
[52] U.S. Cl. .......................... 257/724; 257/691; 257/705
[58] Field of Search ............................... 257/177, 691, 257/724, 723, 705

[56] References Cited

U.S. PATENT DOCUMENTS

| | | | |
|---|---|---|---|
| 4,614,964 | 9/1986 | Sutrina | 257/691 |
| 4,729,010 | 3/1988 | Tsuchiya et al. | 257/705 |
| 4,907,068 | 3/1990 | Amann et al. | 257/724 |
| 5,250,821 | 10/1993 | Ferla et al. | 257/177 |
| 5,313,098 | 5/1994 | Tumpey et al. | 257/712 |
| 5,347,160 | 9/1994 | Sutrina | 257/691 |

FOREIGN PATENT DOCUMENTS

| | | | |
|---|---|---|---|
| 431420 | 1/1991 | European Pat. Off. | 257/177 |
| 57-30357 | 2/1982 | Japan | 257/724 |

*Primary Examiner*—Sara W. Crane
*Assistant Examiner*—Courtney A. Bowers

[57] ABSTRACT

A plurality of power semiconductor switching devices are included in a circuit module in a pattern whereby interconnecting lead lengths are minimized to provide improved circuit characteristics and to insure uniform current sharing when said devices are paralleled during switch-on, switch-off and steady state conditions.

11 Claims, 3 Drawing Sheets

INTERCONNECTION ARRANGEMENT FOR POWER SEMICONDUCTOR SWITCHING DEVICES

This application is a continuation of application Ser. No. 08/053,747, filed Apr. 29, 1993, now abandoned.

BACKGROUND OF THE INVENTION

When interconnecting an plurality of power semiconductor switching devices such as metal oxide semiconductor controlled thyristors (MCT's), insulated gate bipolar transistors (IGBT's), or metal oxide semiconductor field effect transistors (MOSFET's), it is important to minimize inequalities among the interconnected devices with respect to heat dissipation, power sharing and a variety of thermally influenced performance characteristics, as well as signal distortion. More specifically, it is important to minimize differential voltages between the anodes of the power semiconductor switching devices when said devices are paralleled at switch-on, switch-off and steady state conditions; to equalize the electrical impedances between the anodes and cathodes of the paralleled devices; and to optimize current sharing between the paralleled devices during switch-on, switch-off and steady state conditions.

Accordingly, it is the object of the present invention to arrange the plurality of power semiconductor switching devices to minimize interconnecting lead lengths to insure the aforementioned results.

SUMMARY OF THE INVENTION

This invention contemplates an interconnection arrangement for power semiconductor switching devices wherein a plurality of said devices are mounted to a substrate and the substrate is mounted to a case to provide a circuit module. In order to provide short interconnecting lead lengths for a variety of advantages including uniform current sharing for each of the plurality of power semiconductor switching devices, the devices are arranged in a particular pattern such as, for example, a circular or elliptical pattern and the module circuitry originates from the center of the pattern. Mechanical and electrical symmetry are maintained from the origin of the circuitry to the output of the circuit module.

DETAILED DESCRIPTION OF THE INVENTION

Switching circuits include a plurality of power semiconductor switching devices mechanically attached to a ceramic substrate via soldering or some other like process. The substrate, in turn, is likewise mechanically attached to a case, whereby a power semiconductor switching device circuit module is formed. The electrical internal interconnections for the module are accomplished using metallic flat and round buses/wires which are sized by current density, line impedance and current sharing associated with each power semiconductor switching device.

A module case is fabricated from a metallic or a ceramic/metallic material and is constructed so that the attachment of the circuit module thereto will yield acceptable mechanical and thermal bond properties enhancing heat dissipation from each power semiconductor device. The case is constructed with, for example, a two-piece base and side walls. Lids for the case are constructed of a thin metallic or ceramic/metallic material and are affixed to the base. Electrical interfaces to the circuit module are accomplished using mechanical feedthroughs encased in a ceramic or glass seal material. The case is hermetically sealed for the purposes desired to provide a package for the module. A package of the type described is disclosed and claimed in commonly assigned, U.S. application Ser. No. 08/043,688 (File No. 352-92-002) entitled Packaging Arrangement For Power Semiconductor Devices filed by John J. Tumpey, et al, on Apr. 8, 1993, U.S. Pat. No. 5,313,098.

Figure 1:
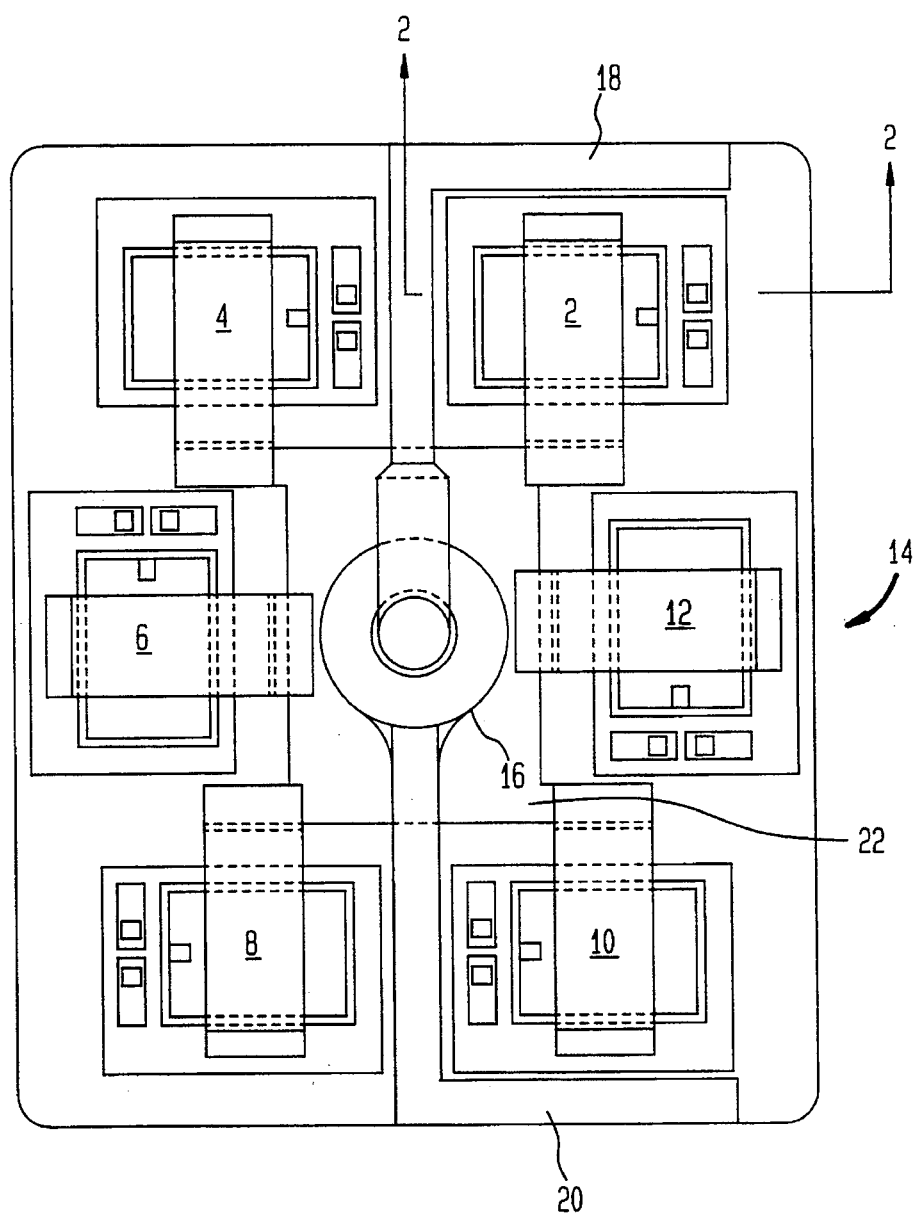
FIG. 1 is a top view of one form of a circuit module according to the invention wherein a plurality of power semiconductor switching devices are arranged in an elliptical pattern.

With the above in mind, reference is first made to FIG. 1, wherein one form of the invention is shown. A plurality of power semiconductor switching devices shown as six in number and designated by the numerals 2, 4, 6, 8, 10 and 12 are arranged in an elliptical pattern to provide a circuit module 14. The circuitry for module 14 originates from the center 16 thereof.

As shown in the figure, power semiconductor switching devices 2–12 are connected to a common anode bus 18 and are connected to a common cathode bus 20. A common cathode collector is designated by the numeral 22.

Figure 2:
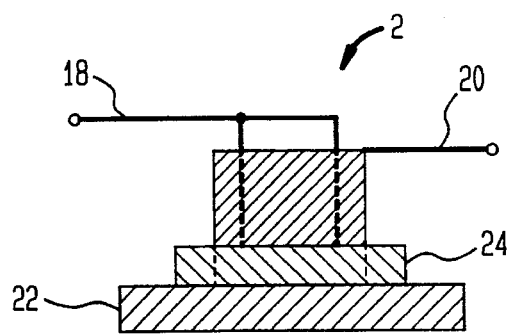
FIG. 2 is a sectional view taken along line 2—2 in FIG. 1.

With reference to FIG. 2, center point 16 of circuitry 14 is constructed in two layers. The lower layer includes common cathode collector 22 and the upper layer includes a common anode collector 24. Cathode collector 22 and anode collector 24 are connected to power semiconductor switching device 2. Anode bus 18 is connected to anode collector 24 and cathode bus 20 is connected to cathode collector 22. Like interconnections are made to power semiconductor switching devices 4–12.

Figure 3:
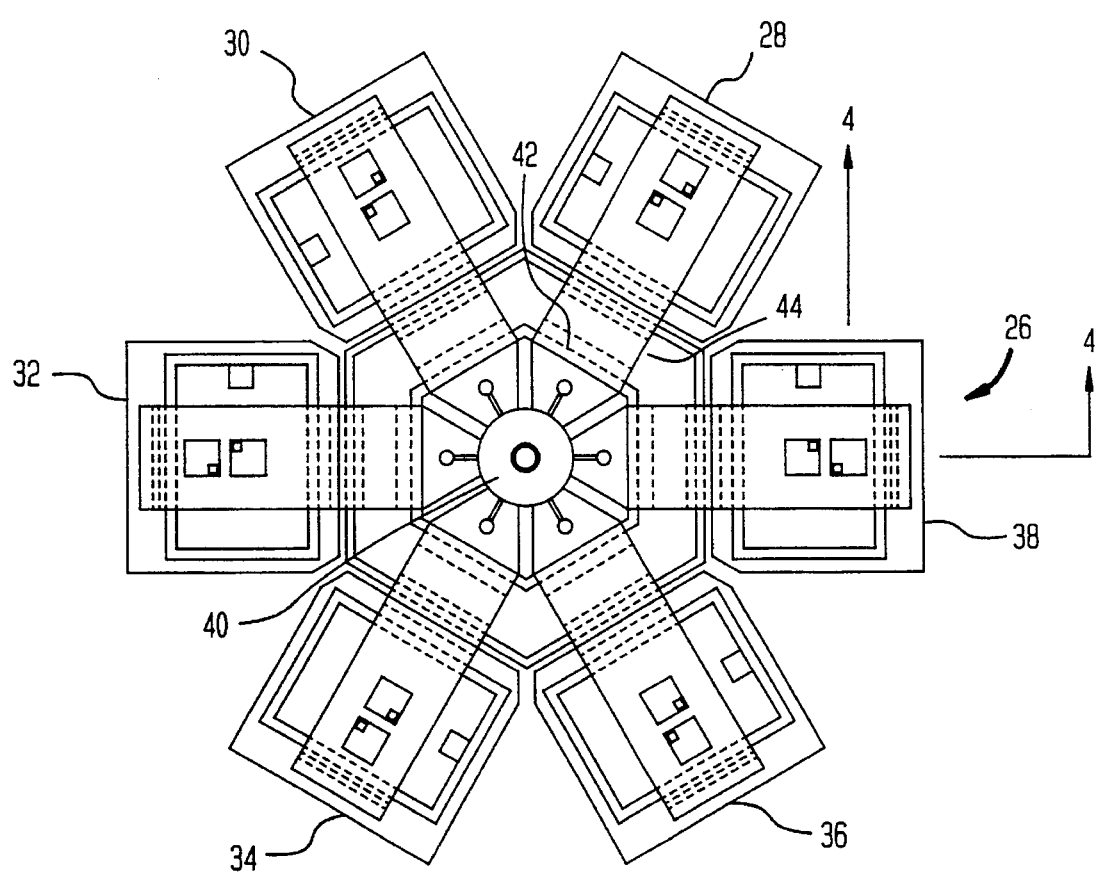
FIG. 3 is a top plan view of another form of a circuit module according to the invention wherein a plurality of power semiconductor switching devices are arranged in a circular pattern.

With reference now to FIG. 3, a circuit module is designated by the numeral 26 and includes a plurality of power semiconductor switching devices shown as six in number and designated by the numerals 28, 30, 32, 34, 36 and 38. Power semiconductor switching devices 28–38 are arranged in a circular pattern as shown in the figure. All circuitry for module 26 originates from the center of the module which is in effect a driver circuit 40 for driving power semiconductor switching devices 28–38.

Power semiconductor switching devices 28–38 are connected to a common cathode collector 42 and to a common anode collector 44.

Figure 4:
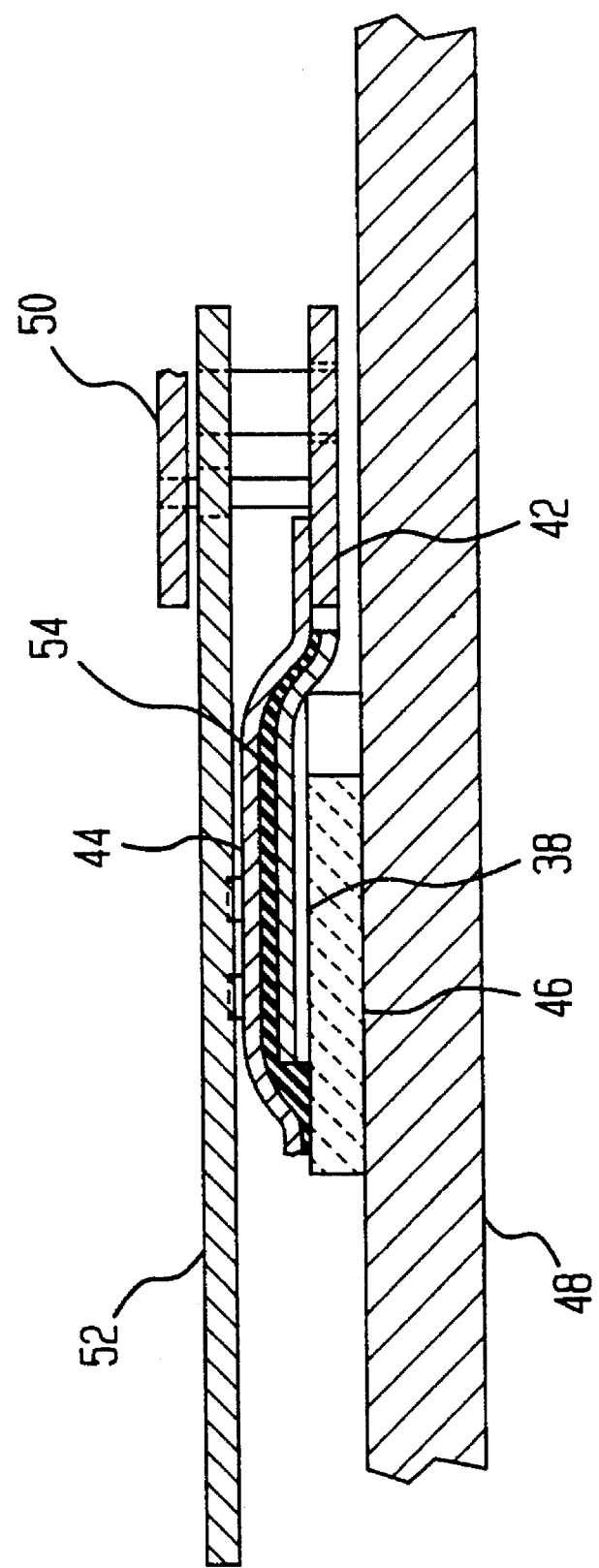
FIG. 4 is a sectional view taken along line 4—4 in FIG. 3.

With reference now to FIG. 4, power semiconductor device 38 is mounted to a ceramic substrate 46 and which substrate 46 is, in turn, mounted to a metallic or ceramic/metallic case 48.

Cathode collector 42 is connected to a common cathode bus 50 and anode collector 44 is connected to a common anode bus 52. Cathode collector 42 and anode collector 44 are insulated via an insulation layer 54. Like interconnections are made to power semiconductor switching devices 28–36.

It will now be seen that an interconnection arrangement for power semiconductor switching devices is provided whereby a plurality of devices are mounted in patterns to provide a circuit module. The patterns are such that interconnecting lead lengths for the power semiconductor switching devices are minimized for imparting a variety of advantages to the circuit module including uniform current sharing for each of said devices.

All circuitry originates from the center of the patterns and mechanical and electrical symmetry are maintained from the origin of the circuitry to the output of the circuit module via the cathode and anode buses. In the form of the invention shown in FIG. 3, driver circuitry for the power semiconductor switching devices is at the center of the circuit geometry. This arrangement utilizes the unused area of the module, therefore reducing the overall module size and further reducing interconnection impedance as well as reducing signal distortion normally associated with prior art circuit modules of the type described.

In addition to the electrical considerations as aforenoted, the configuration of the invention as shown in FIG. 3 reduces the interfacial electrical connections thus mechanically increasing the reliability of the overall module.

With the above description of the invention in mind, reference is made to the claims appended hereto for a definition of the scope of the invention.

What is claimed is:

1. An interconnection arrangement for power semiconductor switching devices, comprising:

a plurality of power semiconductor switching devices mounted to a substrate and the substrate mounted to a case to provide a circuit module, said case being effective for enhancing heat dissipation from each of the plurality of semiconductor switching devices;

the plurality of power semiconductor switching devices mounted to the substrate in a pattern so as to minimize a length of interconnecting leads for said devices;

module circuitry having an origin and an input and an output at the center of the pattern; and said pattern being such that mechanical and electrical symmetry of the power semiconductor switching devices are maintained from the origin of the circuitry to the circuit module output, said pattern being effective as means whereby current sharing between each of said plurality of semiconductor switching devices is optimized when said switching devices are paralleled during switch-on, switch-off and steady state conditions.

2. An arrangement as described by claim 1, wherein: the plurality of power semiconductor switching devices are mounted to the substrate in an elliptical pattern.

3. An arrangement as described by claim 1, wherein: the plurality of power semiconductor devices are mounted to the substrate in a circular pattern.

4. An arrangement as described by claim 1, wherein the module circuitry includes:

common anode and cathode buses providing the circuit module output;

a common anode collector connected to the common anode bus;

a common cathode collector connected to the common cathode bus; and each of the power semiconductor switching devices connected to the common anode collector and to the common cathode collector.

5. An arrangement as described by claim 1, wherein:

the origin of the module circuitry at the center of the pattern includes a driver circuit for driving the plurality of power semiconductor switching devices.

6. A method for interconnecting power semiconductor switching devices, comprising:

arranging a plurality of power semiconductor switching devices in a pattern so as to minimize a length of interconnecting leads for said devices;

mounting said plurality of power semiconductor switching devices in said pattern on the substrate, and mounting said substrate to a case, said case enhancing heat dissipation from each of the plurality of semiconductor switching devices;

originating module circuitry at the center of the pattern and having an input and an output at the pattern center; and selecting the pattern so that mechanical and electrical symmetry of the power semiconductor switching devices is maintained from the center of the pattern to the circuit module output, and said pattern selection being effective for optimizing current sharing between each of the plurality of semiconductor switching devices upon paralleling said devices during switch-on, switch-off and steady state conditions.

7. A method as described by claim 6, wherein:

arranging the plurality of power semiconductor devices in a pattern includes arranging said devices in an elliptical pattern.

8. A method as described by claim 6, wherein:

arranging the plurality of power semiconductor devices in a pattern includes arranging said devices in a circular pattern.

9. A method as described by claim 6, including:

connecting each of the power semiconductor switching devices to a common anode collector and to a common cathode collector;

connecting the common cathode collector to a common cathode bus; and connecting the common anode collector to a common anode bus.

10. A method as described by claim 9, including:

providing the circuit module output at the common anode and cathode buses.

11. A method as described by claim 6, wherein originating the module circuitry at the center of the pattern includes:

providing a driver circuit at the center of the pattern for driving the plurality of power semiconductor switching devices.

* * * * *